US008633053B2

(12) United States Patent
Detje et al.

(10) Patent No.: US 8,633,053 B2
(45) Date of Patent: Jan. 21, 2014

(54) PHOTOVOLTAIC DEVICE

(75) Inventors: Martin Detje, Radebeul (DE); Iris Maege, Dresden (DE); Lars Voelkel, Dresden (DE)

(73) Assignee: Qimonda AG, Munich (DE)

( * ) Notice: Subject to any disclaimer, the term of this patent is extended or adjusted under 35 U.S.C. 154(b) by 480 days.

(21) Appl. No.: 12/638,674

(22) Filed: Dec. 15, 2009

(65) Prior Publication Data

US 2010/0263720 A1    Oct. 21, 2010

(30) Foreign Application Priority Data

Dec. 15, 2008   (EP) ..................................... 8021721

(51) Int. Cl.
*H01L 31/18* (2006.01)
*H01L 31/042* (2006.01)
*H01L 31/0236* (2006.01)

(52) U.S. Cl.
USPC ............. 438/72; 136/252; 136/256; 136/258; 136/261; 427/299

(58) Field of Classification Search
CPC ................... H01L 31/02167; H01L 31/02168; G02B 1/11; G02B 1/111; Y02E 10/50
USPC ............. 438/72, 782; 257/E31.127; 136/256, 136/252, 258, 261; 427/299
See application file for complete search history.

(56) References Cited

U.S. PATENT DOCUMENTS

| 4,106,951 | A | * | 8/1978 | Masi | 136/263 |
|---|---|---|---|---|---|
| 4,343,830 | A | * | 8/1982 | Sarma et al. | 438/92 |
| 4,361,598 | A |   | 11/1982 | Yoldas | |
| 4,557,037 | A | * | 12/1985 | Hanoka et al. | 438/57 |
| 4,592,925 | A |   | 6/1986 | Du Pont et al. | |
| 4,609,565 | A | * | 9/1986 | Yates | 438/72 |
| 4,612,698 | A | * | 9/1986 | Gonsiorawski et al. | 438/72 |
| 4,650,695 | A | * | 3/1987 | Gregory | 427/527 |
| 4,945,065 | A | * | 7/1990 | Gregory et al. | 438/72 |
| 5,010,040 | A | * | 4/1991 | Vayman | 438/98 |
| 6,638,630 | B2 | * | 10/2003 | Park et al. | 428/447 |
| 6,956,097 | B2 | * | 10/2005 | Kennedy et al. | 528/31 |
| 7,264,872 | B2 | * | 9/2007 | Walker et al. | 428/328 |
| 2002/0011462 | A1 | * | 1/2002 | Richter et al. | 216/41 |
| 2004/0043210 | A1 | * | 3/2004 | Seto et al. | 428/331 |
| 2004/0137734 | A1 | * | 7/2004 | Chou et al. | 438/689 |
| 2006/0019114 | A1 | * | 1/2006 | Thies et al. | 428/522 |
| 2008/0000519 | A1 | * | 1/2008 | Takahashi | 136/252 |

(Continued)

FOREIGN PATENT DOCUMENTS

| EP | 1763086 A1 | 3/2007 | |
|---|---|---|---|
| EP | 1890172 A1 * | 2/2008 | .............. G02B 1/11 |
| WO | 2008096711 A1 | 8/2008 | |

OTHER PUBLICATIONS

Dinguo Chen, "Anti-reflection (AR) coatings made by sol-gel processes: A review", Jun. 2001, Solar Energy Materials and Solar Cells, vol. 68, Issues 3-4, pp. 313-336.*

(Continued)

*Primary Examiner* — Kevin Parendo
*Assistant Examiner* — Pauline Vu
(74) *Attorney, Agent, or Firm* — Patterson & Sheridan, LLP

(57) ABSTRACT

A photovoltaic device is described. The photovoltaic device comprises an organic-based antireflection layer. A method of making a photovoltaic device is also described.

10 Claims, 3 Drawing Sheets

(56) References Cited

U.S. PATENT DOCUMENTS

| | | | |
|---|---|---|---|
| 2008/0135091 A1* | 6/2008 | Cheng et al. | 136/252 |
| 2008/0185041 A1* | 8/2008 | Sharma et al. | 136/261 |
| 2008/0216893 A1* | 9/2008 | Russell et al. | 136/261 |
| 2008/0232762 A1* | 9/2008 | Kuramoto et al. | 385/145 |
| 2008/0276990 A1* | 11/2008 | Zhou et al. | 136/261 |
| 2009/0071532 A1* | 3/2009 | Chan et al. | 136/252 |
| 2009/0266396 A1* | 10/2009 | Niira et al. | 136/244 |
| 2010/0326522 A1 | 12/2010 | Okaniwa | |

OTHER PUBLICATIONS

Bhushan Sopori, "Silicon solar-cell processing for minimizing the influence of impurities and defects", 2002, Journal of Electronic Materials, vol. 31, Issue 10, pp. 972-980.*

Yagi, H., et al., "Hydrogen passivation of large-area polycrystalline silicon solar cells by high-current ion implantation", 1988, Photovoltaic Specialists Conference, Conference Record of the Twentieth IEEE. IEEE, 1988.*

* cited by examiner

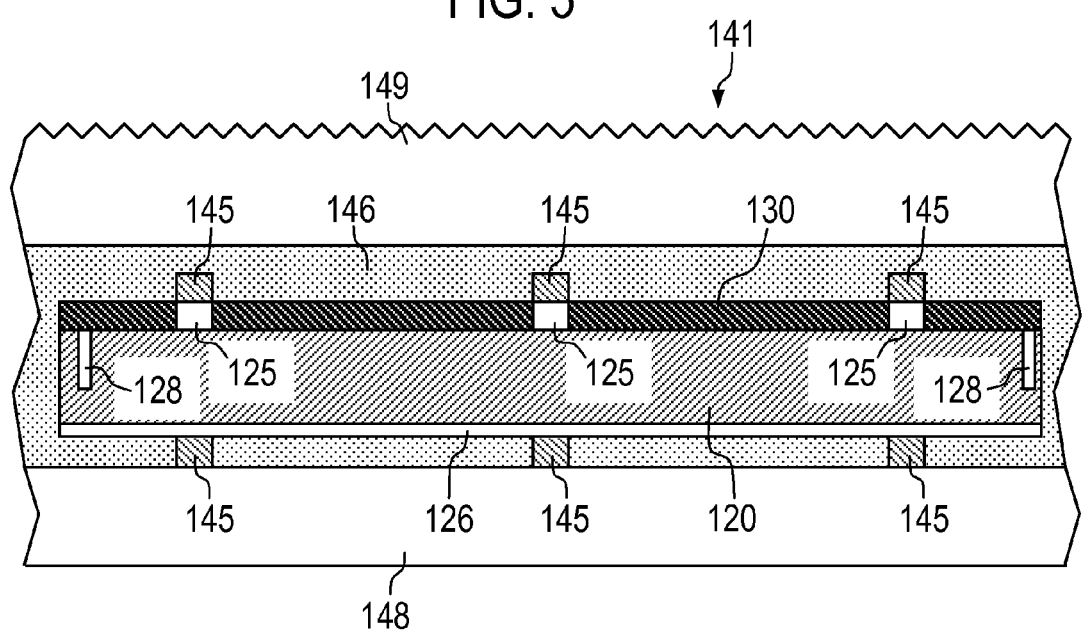

PHOTOVOLTAIC DEVICE

CROSS-REFERENCE TO RELATED APPLICATIONS

This application claims foreign priority benefits under 35 U.S.C. §119 to European patent application number EP 8021721.9, filed 15 Dec. 2008. This related patent application is herein incorporated by reference in its entirety.

FIELD OF THE INVENTION

The invention relates to a photovoltaic device and to a method of making a photovoltaic device.

BACKGROUND OF THE INVENTION

A solar cell is a device which converts electromagnetic radiation (in general sunlight) into electric energy. The energy conversion is based on the absorption of radiation in the solar cell, thereby generating positive and negative charge carriers (electron-hole pairs). The generated charge carriers are furthermore separated from each other, and are transferred to different contacts.

Common solar cells are made of the semiconductor material silicon, and comprise a p-n junction which is arranged between a so-called "emitter" and a so-called "basis". By means of the p-n junction, an inner electric field is provided which serves for the above mentioned charge carrier separation. Such a photovoltaic structure may e.g. include a thin n-conductive layer (n-type emitter) and an adjacent p-conductive region (p-type basis). The different electric properties of emitter and basis may be defined by respective doping.

One main demand of solar cells is to provide a high efficiency and a high energy conversion factor. The development of solar cells therefore tends to minimize potential losses such as optical losses (due to e.g. reflection, shadowing effects, etc.) and recombination losses (recombination of the produced charge carriers).

Concerning reflection losses, it is e.g. known to provide an antireflection layer for the solar cells which is also referred to as ARC-layer (antireflective coating). For this purpose, a reflection minimizing silicon nitride layer (SiN) is typically deposited on silicon solar cells after producing the emitter, e.g. by depositing a hydrogen-rich silicon nitride layer (SiNx:H). By performing a temperature step (which is performed in the course of making contacts and which is also referred to as "firing"), hydrogen of the silicon nitride layer may be introduced into the solar cells, thereby performing a passivation of defects and making a reduction of recombination losses possible. However, the deposition of silicon nitride which is conventionally carried out by means of a PECVD-process (plasma enhanced chemical vapor deposition) is associated with high effort and high costs.

U.S. Pat. No. 4,592,925 discloses a solar cell having a protective coating consisting of polyimide. Apart from the protective coating, the solar cell comprises an inorganic antireflection layer which is arranged on a substrate of the solar cell. A combination of metal oxides and a combination of a metal oxide and silicon oxide are disclosed as materials for the antireflection layer.

U.S. Pat. No. 4,361,598 describes a method of producing an inorganic antireflection layer for a solar cell. In the method, a solution comprising different components is applied to the solar cell, and a heating step is carried out in order to remove solvents and organic components. Furthermore, it is described to leave a rest of organic components in the inorganic antireflection layer if necessary.

SUMMARY

Various aspects of the present invention provide an enhanced photovoltaic device and an enhanced method of making a photovoltaic device.

For one embodiment of the invention, a photovoltaic device comprises an organic-based antireflection layer.

For another embodiment of the invention, a method of making a photovoltaic device comprises providing a substrate, the substrate comprising a photovoltaic structure, and forming an organic-based antireflection layer on the substrate.

BRIEF DESCRIPTION OF THE DRAWINGS

These and other features of the present invention will become clear from the following description taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIG. 5 illustrates a schematic view of another photovoltaic module.

DETAILED DESCRIPTION OF THE PREFERRED EMBODIMENT

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 1:
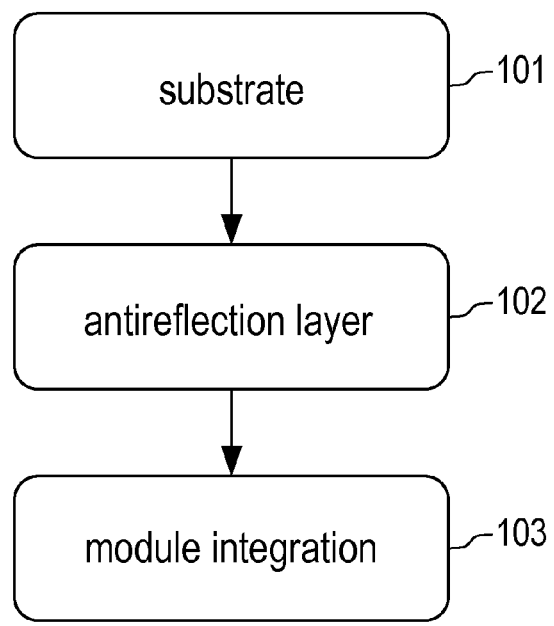
FIG. 1 illustrates a flow diagram of a method of producing a photovoltaic module.

FIG. 1 shows a flow diagram of a method of producing a photovoltaic module, the photovoltaic module comprising at least one solar cell. In the method, a substrate (i.e. at least one substrate) is provided, the substrate comprising a photovoltaic structure. The photovoltaic structure which may e.g. comprise a p-n junction is configured to cause a separation of charge carriers being generated in the substrate due to radiation or light radiation, respectively.

Apart from the photovoltaic structure, the provided substrate may comprise further structures such as a contact structure for contacting the substrate. In this manner, the substrate may be an already produced solar cell without an antireflection coating.

In a further step 102, an organic-based and (highly) transparent antireflection layer is formed on the provided substrate. The antireflection layer serves for avoiding or reducing reflections of a radiation illuminating the substrate so that a high fraction of the radiation is coupled into the substrate and produces free charge carriers. At this, a relatively high index of refraction may be considered for the antireflection layer, which may promote the antireflective effect.

The transparent antireflection layer comprises an organic-based material or a polymer-based material, respectively. At this, the entire antireflection layer may be composed of an organic material. Different organic material components and mixtures or blends of organic and inorganic materials may be considered, as well, wherein an organic component (or organic components) may represent a substantial part of the antireflection layer. Potential examples are a resist material, a spin-on-glass, a sol-gel material and antireflective coating materials being well-known from semiconductor fabrication technologies. With respect to material blends, a base material and pigments or particles being included in the base material may be considered as well. At this, the base material may serve as a (polymer) matrix or (organic) binder, respectively. Further examples of materials and material mixtures are described further below.

The formation of an organic-based antireflection layer which may e.g. comprise spin-coating, spray-coating or dip-coating, may be carried out in an easy and cost-efficient manner. This is in particular the case when comparing the above-described formation of an inorganic antireflection layer (from silicon nitride) by means of a CVD-process. Details concerning potential methods and processes for forming the organic or organic-based antireflection layer, respectively, are described further below.

In a further step 103 which is referred to as "module integration", the substrate or solar cell being coated with the antireflection layer is further processed in order to provide a photovoltaic module. At this, the substrate may e.g. be provided with a cover or may be framed by means of one or several glass panels, thereby providing a protection of the substrate against e.g. mechanical impacts or a weather influence. For this purpose, a lamination method may e.g. be performed. With respect to the step 103, it is also possible to assemble the photovoltaic module of several substrates or solar cells, respectively, wherein the individual substrates are electrically connected to each other.

In the production of a photovoltaic module, it is further possible to combine steps 102 and 103 of the method depicted in FIG. 1. Such a procedure may e.g. be favorable concerning several substrates, because the formation of an antireflection layer (step 102) may be carried out in the course of the "module integration" or of the lamination process (step 103), respectively, and therefore formation of an antireflection layer may be commonly performed on several substrates. Here, the several substrates may already be arranged on or attached to a backside cover or glass panel, the cover or panel being applied in the production of the module.

The method described with respect to FIG. 1 may e.g. be applied in the production of photovoltaic modules comprising mono- or poly-crystalline silicon solar cells. This is in the following described in detail with respect to FIGS. 2 to 5.

Figure 2:
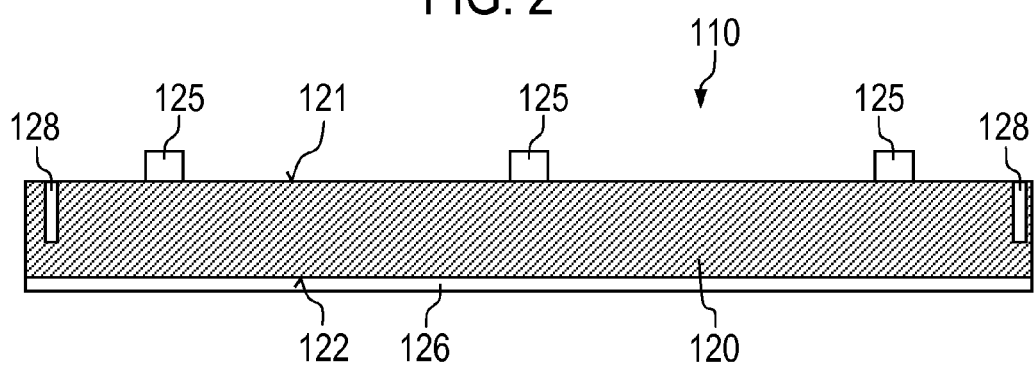
FIG. 2 illustrates a schematic view of a solar cell.

FIG. 2 shows a schematic illustration of a solar cell 110 (without an antireflection layer), wherein the depicted solar cell 110 may be such a crystalline solar cell 110. The solar cell 110 comprises a silicon substrate 120 comprising a (not depicted) photovoltaic structure. The substrate 120 furthermore comprises contact elements 125, 126 and isolation grooves 128. A potential method of producing the solar cell 110 is described in the following.

In the method, an initial silicon substrate 120 which is also referred to as wafer and which may already comprise a basic doping is provided. As an example, the substrate 120 may be of p-type conductivity through being doped by boron. Moreover, a diffusion or doping process is carried out under the effect of temperature (in an oven), thereby producing a layer in the area of a front side 121 of the substrate 120 having a conductivity type contrary to the rest of the substrate (not depicted), the front side 121 of the substrate 120 facing light when operating the solar cell 110. This layer is also referred to as emitter, and the rest of the substrate is referred to as basis.

With respect to a p-conductive substrate 120, the (heated) substrate 120 may e.g. be subjected to a phosphoric atmosphere. As a consequence, a diffusion of phosphor into the substrate 120 may be effected, thereby producing an emitter of n-type conductivity. Consequently, a p-n junction is provided between emitter and basis which serves for the separation of charge carriers being produced by light radiation in the operation of the solar cell 110.

Apart from the above-described method, it is possible to carry out other processes or doping methods in order to provide the initial substrate 120 with a photovoltaic structure. Furthermore, it is possible to provide a photovoltaic structure having emitter and basis, wherein emitter and basis comprise conductivities in a converse way (i.e. p-type emitter and n-type basis).

In the course of producing the solar cell 110 of FIG. 2, further processes may be carried out which are described in the following. One of such processes is a passivation of the substrate 120 by introducing hydrogen which is carried out in order to passivate defects and to thereby reduce recombination losses of charge carrier pairs in the operation of the solar cell 110. With respect to hydrogen passivation which may be performed in an additional oven process, different methods may be considered. It is e.g. possible to use an ion source which provides hydrogen ions or to use a hydrogen plasma. Alternatively, the (heated) substrate 120 may be subjected to a hydrogen atmosphere.

A hydrogen passivation being carried out by means of one of the mentioned processes or a different process may be conducted in the course of the above-described diffusion process carried out for producing the emitter. As an example, it is possible to perform both processes one after another in the same oven chamber or oven device, respectively.

Furthermore, the substrate 120 may be structured or roughened in an additional process step which is carried out in order to provide a surface texture, in particular in the area of the front face 121 of the substrate 120 (not depicted). Such a texture may, in addition to an antireflection layer, allow for reducing reflections in the operation of the solar cell 110. Forming a texture may e.g. be carried out by means of an etch process (texture etch) which may e.g. be conducted prior to forming the photovoltaic structure or the emitter, respectively.

In addition, further processes may be performed in order to complete the solar cell 110. As an example, the formation of isolation trenches 128 in the substrate 120 after the formation of the emitter may be considered as depicted in FIG. 2, thereby avoiding a potential short circuit in the substrate 120 between the front side 121 and a back side 122 being opposite to the front side 121. With respect to the above-described diffusion process, it is possible that diffusion takes place at all areas of the substrate 120 being exposed to the respective dopant (e.g. phosphor) so that the emitter may also extend over the side edges of the substrate 120 to the back side 122. By means of the isolation trenches 128 being e.g. formed in an edge area of the front side 121 as depicted in FIG. 2, such emitter regions may be separated from the emitter at the front side 121. The depicted isolation trenches 128 may e.g. be produced by means of a laser.

Instead of producing isolation trenches 128 in the area of the front side 121 of the substrate 120, such trenches may also be provided at a different area, e.g. in the area of the back side 122 of the substrate 120 (not depicted). Furthermore, an electric separation of front and back side 121, 122 may be realized in a different way compared to the formation of trenches 128. An example is to etch the lateral edges of the substrate 120.

A further method step consists in forming an electrically conductive or metallic contact structure on the substrate 120, thereby contacting the poles of the p-n junction (i.e. emitter and basis). For this purpose, relatively small contacts 125 may be formed on the front side 121 of the substrate 120 as shown in FIG. 1. The front side contacts 125 may, in a plan view, comprise the form of thin fingers, thereby allowing for small shadowing effects. Contrary thereto, a large area contact 126 (back side contact or back side metallization) is provided at the back side 122.

The formation of the contacts 125, 126 may be carried out in different ways. For ways of illustration, it is possible to apply respective metallic contacts 125, 126 on the front side 121 and the back side 122 of the substrate 120, e.g. by means of printing. Additionally, a temperature or sinter step ("firing") may be performed, if necessary, in order to provide an enhanced connection of the contacts 125, 126 to the substrate 120.

Figure 3:
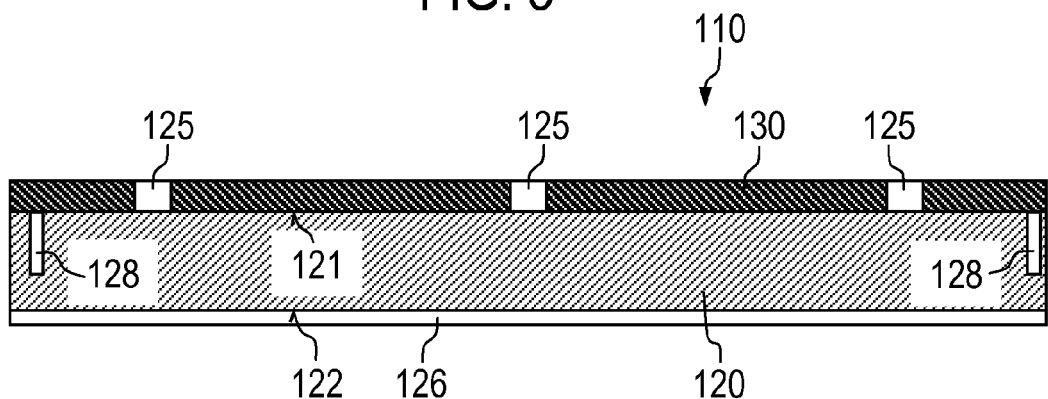
FIG. 3 illustrates a schematic view of a solar cell comprising an antireflection layer.

After performing the above-mentioned processes, the solar cell 110 depicted in FIG. 2 is substantially completed. In order to reduce radiation losses due to reflections occurring in the area of the front side 121 of the substrate 120, it is intended (in addition of an optional texture) to coat the solar cell 110 with a transparent and organic-based antireflection layer 130 as shown in FIG. 3. With respect to the antireflection layer 130 which is directly arranged on the substrate 120 or on the front side 121, and which comprises an organic-based or polymer-based material, a plurality of different materials and material mixtures may be considered.

A potential material for the antireflection layer 130 is a photo-resist material which may comprise a high index of refraction in addition. This includes aromatic compounds such as polyhydroxystrol, polyhydroxystyren (PHS), polystyrol, polynaphthlene, or other resist compounds and resist polymers. Further possible photo-resist materials are alicyclic compounds like e.g. (meth)acrylates (e.g. polymethyl methacrylate PMMA, polymethyl acrylate PMA) and polyester. Heterocyclic compounds may be considered, as well.

An organic-based spin-on-glass or an organic-based sol-gel layer may be considered for the antireflection layer 130, as well. Potential examples are organosiloxane, metal-acrylates, and acryl-metals.

Moreover, a nanoresist or nanoresist material may be applied for the antireflection layer 130. An example are pigment dispersions or pastes. Such materials may comprise mixtures or blends of an (organic or organic-based) binder (e.g. a methacrylate polymer dispersion) and nano particles (e.g. $ZnO/SiO_2$, $TiO_2/SiO_2$, $TiO_2$, or other metal oxide/silicon oxide).

It is furthermore possible to apply (further) organic-based antireflective coating materials being known from semiconductor fabrication technologies such as conductive BARC materials (bottom antireflective coating). These materials may include heterocyclic compounds.

Moreover, further organic-based materials comprising pigments and/or pigment blends may be considered. Here, the respective pigments or particles (e.g. $ZnO$, $TiO_2$, $TiO_2/SiO_2$-blends) may provide a high refractive index. Such materials may also include e.g. metal organics such as acetats, esters, etc.

In order to form the antireflection layer 130, the respective antireflection material (which may comprise different materials or material mixtures as the case may be) is applied to the substrate 120 of the solar cell 110 by means of an appropriate method. At this, the antireflection layer 130 may be produced with a predetermined thickness which may promote a high antireflective effect. The formation of the antireflection layer 130 may be performed by a number of different methods and processes (which also depends on the respective antireflection material), some of these methods being described in the following. At this, it may be considered to apply the antireflection material to the solar cell 110 or the substrate 120 in liquid form or to apply a solution including the antireflection material.

The application may e.g. include a spin-coating process. Here, the antireflection material (or a respective solution) is applied to the solar cell 110 or the substrate 120, respectively (e.g. by means of dripping) and the solar cell 110 is rotated (e.g. by means of a rotary table). Such a method allows for the production of the antireflection layer 130 in a relatively homogeneous way and with a predetermined layer thickness.

Moreover, the antireflection layer 130 may also be produced by spray-coating the substrate 120 with an antireflection material (or with a solution including the antireflection material) or by means of a dispersion process. Furthermore, it is possible to perform a dip-coating process in which the solar cell 110 (or a front side portion of the solar cell 110) is dipped into the antireflection material or a solution including the antireflection material. Concerning such processes, an additional spinning of the solar cell 110 may be performed (subsequent to the application of the antireflection material), as the case may be. A further potential method consists in printing the antireflection material on the substrate 120.

In addition to such deposition or application processes, further processes may be performed. As an example, a drying process may be carried out. Drying the antireflection material may e.g. be performed by spinning the solar cell 110 or by providing an airflow. Additionally or alternatively, drying may also be performed by conducting a temperature step or bake step. Here, the solar cell 110 may e.g. be heated to a temperature between 50° C. and 150° C., starting from room temperature.

A further potential process is a cleaning step which is conducted in order to remove the antireflection material from unwanted areas. As an example, the antireflection material may be removed from the back side of the solar cell 110 (if present at this place), thereby uncovering the back side contact 126. In addition, the front side contacts 125 or a top face of the same may be uncovered or exposed, as the case may be.

Apart from drying, a temperature step may be performed for different purposes, as well. Baking may e.g. provoke a cross-linking or polymerization of the organic based antireflection material (or of a respective base material). Furthermore, a temperature step may also be conducted in order to remove solvents, and to serve for a film stabilization. With respect to such purposes, heating may be conducted to a temperature in a range between e.g. 70° C. and 250° C.

Provided that a temperature step is conducted, a subsequent cooling step (cooling to room temperature) may be considered. As a consequence, the solar cell 110 having the organic or organic-based antireflection layer 130 which is applied to the substrate 120 is quickly available for further processing. One example for such further processing is the production of a photovoltaic module comprising one or several solar cells 110.

Figure 4:
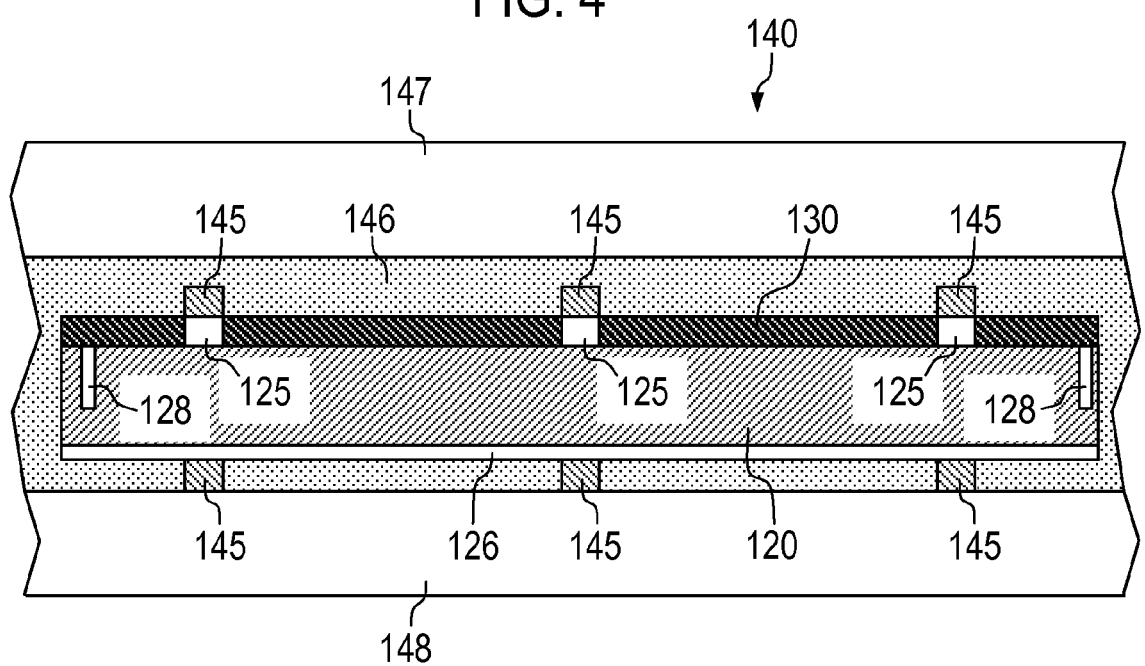
FIG. 4 illustrates a schematic view of a photovoltaic module.

FIG. 4 shows a schematic illustration of an example of such a photovoltaic module 140 comprising the solar cell 110 of FIG. 3. The photovoltaic module 140 comprises two glass panels or glass sheets 147, 148, the solar cell 110 being disposed in between. At this, the solar cell 110 is embedded in a transparent layer 146 which is e.g. formed by melting a respective melt or lamination foil, respectively. Furthermore, electric connection elements 145 in the form of e.g. interconnection wires are applied onto the contacts 125, 126 of the solar cell 110. By means of the connection elements 145, a number of solar cells 110 (FIG. 4 depicts only one solar cell 110) may electrically be connected to each other.

Producing the photovoltaic module 140 may be carried out by means of a lamination method. Such a method may include applying a first foil of a meltable plastics material (e.g. ethylenvinylacetat, EVA, or silicone rubber) on one of the two glass panels 147, 148, applying several solar cells 110 thereon next to each other and contacting the same (by means of the connection elements 145; contacting may also be carried out before), and applying a further foil of the meltable plastics material and the other one of the two glass panels 147, 148 thereon. For the actual lamination, this arrangement may be heated to a temperature of e.g. 150° C. As a consequence, the two foils may be converted into a transparent cross-linked and unmeltable plastics layer 146, the solar cells 110 being embedded in the plastics layer 146 and being connected to the two glass panels 147, 148. Subsequent to the lamination process, further steps such as framing the photovoltaic module 140 may be carried out.

FIG. 5 shows a further embodiment of a photovoltaic module 141. The photovoltaic module 141 substantially comprises the same construction compared to the photovoltaic module 140 of FIG. 4 and may therefore be produced in the same way. Unlike the photovoltaic module 140, the photovoltaic module 141 comprises a front side glass panel 149 which is provided with a texture.

The texture of the glass panel 149 is configured in order to reduce reflections of a radiation in the area of the top face of the glass panel 149 and therefore to reduce associated reflection losses. With respect to such an embodiment, it is possible to omit the above-described (optional) texturization of the front side 121 of a solar substrate 120.

The embodiments described in conjunction with the drawings are exemplary embodiments. Moreover, further embodiments may be realized which comprise further modifications or combinations of features. Concerning the photovoltaic modules 140, 141 depicted in FIGS. 4 and 5, it is e.g. possible to provide a cover element, e.g. a plastics composition foil instead of the back side glass panel 148.

In the production of photovoltaic modules 140, 141, it is furthermore possible to provide solar cells 110 without an organic-based antireflection layer 130 at first (e.g. with a configuration according to FIG. 2), and to apply an antireflection layer 130 (e.g. with one of the above-mentioned processes) only in the course of a lamination method. As an example, with respect to the photovoltaic module 140 of FIG. 4, such a procedure may include arranging a lamination foil and a number of solar cells 110 (without an antireflection layer 130) on a glass panel, subsequently applying the antireflection layer 130 to all of the solar cells 110 in a combined way, afterwards arranging a further lamination foil and a further glass panel thereon, and conducting a temperature step in order to complete the lamination of the module 140. As a consequence, the production of the photovoltaic module 140 may be accelerated. Concerning smaller photovoltaic modules, printing an antireflection layer 130 on the solar cells 110 may be considered.

In the production of a solar cell 110 having an organic-based antireflection layer 130, the application of the antireflection layer 130 prior to producing of contact structures on a solar substrate 120 may be considered as well. In such a case, the antireflection layer 130 may be applied with a structured form or a portion of the applied antireflection material may be removed in an area of the (later produced) contact structures 125, so that the contacts 125 may contact the front side 121 of the respective substrate 120.

Moreover, the formation of an organic or organic-based antireflection layer on a substrate having a photovoltaic structure may also be applied to solar cells being different from the described solar cells 110. This applies e.g. to crystalline solar cells having a configuration different from the configuration shown in FIGS. 2 and 3, and to solar cells, at which the respective substrates comprise a crystalline semiconductor material different from silicon or which e.g. comprise an amorphous semiconductor material or an organic polymer material. In this connection, it is pointed out that the expression "substrate" refers to all devices, carriers, carrier elements, layer arrangements etc. having or providing a photovoltaic structure, the photovoltaic structure being configured or suited in order to make possible a generation of charge carriers due to radiation and a charge carrier separation in the respective "substrate".

Examples of further solar cells which may be considered with respect to the preceding approaches and concepts are thin-film solar cells such as solar cells comprising amorphous silicon or microcrystalline silicon. A further example are solar cells having substrates comprising e.g. Gallium Arsenide (GaAs), Cadmium Tellurite (CdTe), Copper Indium Selenide, Copper Indium Gallium Selenide and Copper Indium Gallium Sulfite, etc.

Another example are organic solar cells or organic polymer cells (also referred to as plastic solar cells) which comprise a substrate or layer sequence having a (or several) polymer material(s). Concerning organic solar cells, a photovoltaic structure may be realized in the form of a so-called donator/acceptor-system, wherein charge carrier separation is based on the gradient of an electrochemical potential.

Furthermore, it is pointed out that details concerning the described processes such as the specification of temperatures are to be considered as examples which may be replaced by other specifications, as the case may be.

Furthermore, other materials may be applied instead of the specified materials in order to form a transparent antireflection layer on a solar cell or substrate, respectively. At this, the above-described methods and processes may be applied as well.

The preceding description describes exemplary embodiments of the invention. The features disclosed therein and the claims and the drawings can, therefore, be useful for realizing the invention in its various embodiments, both individually and in any combination. While the foregoing is directed to embodiments of the invention, other and further embodiments of this invention may be devised without departing from the basic scope of the invention, the scope of the present invention being determined by the claims that follow.

What is claimed is:

1. A method of making a photovoltaic device, comprising:
providing a substrate;
performing a diffusion process to form an emitter on a surface of the substrate;
performing a hydrogen passivation process on a front side of the emitter thereby reducing recombination losses of charge carrier pairs in the operation of the photovoltaic device, wherein the hydrogen passivation process is performed in the course of the diffusion process, wherein the diffusion process and the hydrogen passivation process are performed in the same processing chamber; and
applying an organic-based antireflection layer on the front side of the emitter;
drying the applied organic-based antireflection layer;
after drying, heating the organic-based antireflection layer;
after heating, cooling the organic-based antireflection layer;
removing portions of the organic-based antireflection layer from unwanted areas of the photovoltaic device; and
after cooling the organic-based antireflection layer, providing a glass cover over the organic-based antireflection layer such that the organic-based antireflection layer is between the glass cover and the front side of the emitter.

2. The method according to claim 1, further comprising performing a lamination method.

3. The method according to claim 2, wherein applying the organic-based antireflection layer is performed in the course of the lamination method.

4. The method according to claim 1, wherein applying the organic-based antireflection layer on the front side of the emitter is performed by means of a spin-coating process.

5. The method according to claim 1, wherein the organic-based antireflection layer comprises:
a sol-gel material.

6. The method of claim 1, wherein the organic-based antireflection layer comprises spin-on glass.

7. The method of claim 1, wherein the organic-based antireflection layer comprises a photo-resist material.

8. The method of claim 1, wherein the organic-based antireflection layer comprises a nanoresist material.

9. The method of claim 1, wherein the organic-based antireflection layer comprises an organic base material, wherein the organic base material comprises pigments that provide a high refractive index.

10. The method of claim 1, before providing the glass cover, melting a melt or a lamination foil on the organic-based antireflection layer, wherein the glass cover is placed on the melt or lamination foil.

* * * * *